United States Patent
Mukai et al.

(10) Patent No.: US 11,441,011 B2
(45) Date of Patent: Sep. 13, 2022

(54) THERMALLY CONDUCTIVE MOLDED RESIN ARTICLE

(71) Applicant: BANDO CHEMICAL INDUSTRIES, LTD., Hyogo (JP)

(72) Inventors: Fumihiro Mukai, Kobe (JP); Kotaro Yamaura, Kobe (JP); Hiroki Naito, Kobe (JP); Yasuhiro Sako, Kobe (JP)

(73) Assignee: BANDO CHEMICAL INDUSTRIES, LTD., Hyogo (JP)

( * ) Notice: Subject to any disclaimer, the term of this patent is extended or adjusted under 35 U.S.C. 154(b) by 845 days.

(21) Appl. No.: 16/074,335

(22) PCT Filed: Jan. 31, 2017

(86) PCT No.: PCT/JP2017/003366
§ 371 (c)(1),
(2) Date: Jul. 31, 2018

(87) PCT Pub. No.: WO2017/135237
PCT Pub. Date: Aug. 10, 2017

(65) Prior Publication Data
US 2021/0163708 A1     Jun. 3, 2021

(30) Foreign Application Priority Data

Feb. 1, 2016 (JP) .............................. JP2016-016956

(51) Int. Cl.
| C08K 3/38 | (2006.01) |
| C08K 3/22 | (2006.01) |
| H01L 23/373 | (2006.01) |
| H01L 33/64 | (2010.01) |

(52) U.S. Cl.
CPC ................. *C08K 3/38* (2013.01); *C08K 3/22* (2013.01); *C08K 2003/2227* (2013.01); *C08K 2003/382* (2013.01); *C08K 2201/001* (2013.01); *C08K 2201/005* (2013.01); *C08K 2201/014* (2013.01); *C08K 2201/016* (2013.01); *H01L 23/3737* (2013.01); *H01L 33/641* (2013.01)

(58) Field of Classification Search
CPC . C08K 3/38; C08K 3/01; C08K 3/013; C08K 3/10; C08K 3/22; C08K 3/28; C08K 2003/282; C08K 2003/382; C08K 2201/001; C08K 2201/004; C08K 2201/005; C08K 2201/014; C08K 2201/016; C08L 43/04; C08L 38/04; C08L 27/12; C08L 33/08; C08L 15/02; C08L 19/00; C08L 21/00

See application file for complete search history.

(56) References Cited

U.S. PATENT DOCUMENTS

| 7,038,009 B2* | 5/2006 | Sagal ................. B29C 45/0013 524/404 |
| 2003/0038393 A1* | 2/2003 | Panek ................. B29C 45/1635 264/104 |
| 2006/0188727 A1 | 8/2006 | Ito et al. |
| 2013/0203932 A1* | 8/2013 | Fujisawa ............. B29C 45/0005 524/577 |
| 2014/0349067 A1 | 11/2014 | Usui et al. |

FOREIGN PATENT DOCUMENTS

| JP | H03-200397 | 9/1991 |
| JP | H05-102355 | 4/1993 |
| JP | H10-298894 | 11/1998 |
| JP | 2000-344919 | 12/2000 |
| JP | 2003-174127 | 6/2003 |
| JP | 2005-232313 | 9/2005 |
| JP | 2008-303324 A | 12/2008 |
| JP | 2009-010296 | 1/2009 |
| JP | 2011-178894 | 9/2011 |
| JP | 2013-103375 | 5/2013 |
| JP | 2015-073067 A * | 4/2015 | ............ H01L 23/36 |
| WO | 2013/094613 A1 | 6/2013 |

OTHER PUBLICATIONS

Machine translation (J-Pat Plat) of JP 2015-073067 A, published Apr. 16, 2015, to Hiroki Naito et al. (Year: 2015).*
International Search Report in corresponding Patent Application No. PCT/JP2017/003366, dated Mar. 7, 2017.
Chemical Abstracts Service Jun. 28, 2013, Aramaki "Thermally conductive sheet and method for manufacturing thermally conductive sheet", XP002793691.
EESR issued in EP Patent Application No. 17747393.1, Sep. 6, 2019.

* cited by examiner

*Primary Examiner* — Jane L Stanley
(74) *Attorney, Agent, or Firm* — Greenblum & Bernstein, P.L.C.

(57) ABSTRACT

Provided is a thermally conductive molded resin article that can be inexpensively mass-produced and that exhibits a low thermal resistance value as a result of reducing internal thermal resistance by high filling and reducing interfacial thermal resistance by improving cutting precision. The thermally conductive molded resin article is characterized by comprising a resin and thermally conductive fillers including a first thermally conductive filler and a second thermally conductive filler having a smaller particle size than the first thermally conductive filler. The thermally conductive molded resin article is also characterized in that: the first thermally conductive filler has an aspect ratio of 10 or more and is oriented approximately in the thickness direction of the thermally conductive molded resin article; the resin is a silicone resin, an acrylic rubber, or a fluororubber; and the second thermally conductive filler has a thermal conductivity surpassing 5 W/mK.

2 Claims, 1 Drawing Sheet

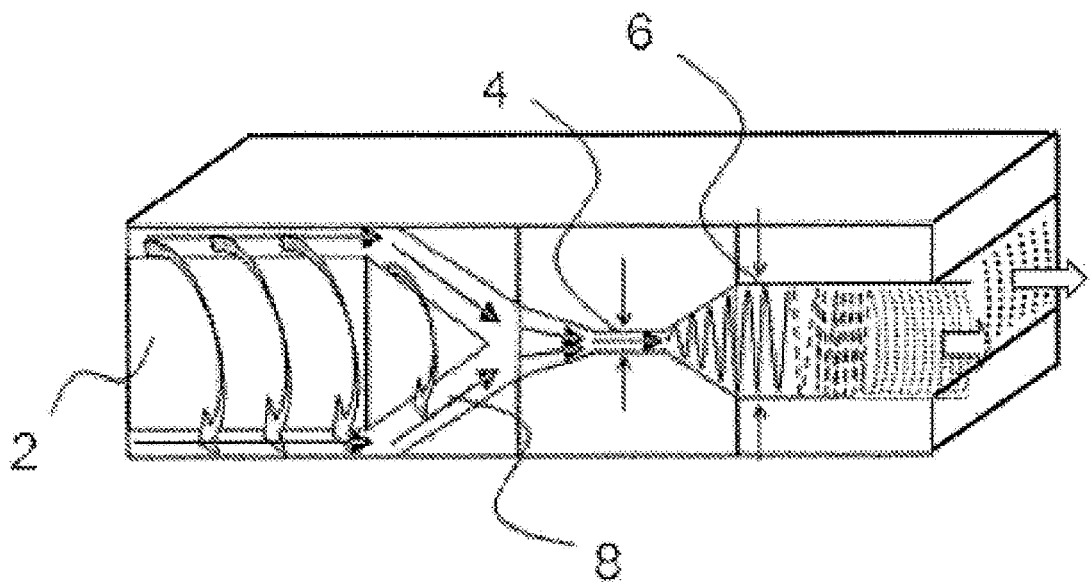

THERMALLY CONDUCTIVE MOLDED RESIN ARTICLE

TECHNICAL FIELD

The present invention relates to a thermally conductive molded resin article, particularly relates to a thermally conductive molded resin article that can be inexpensively mass-produced and that has excellent thermal conductivity in the thickness direction.

BACKGROUND ARTS

In accordance with the rapid advance in high density and thin film of electronic devices, the problem of influence as to heat generated from IC parts, power parts and high brightness LED becomes serious. In response to this problem, a thermally conductive molded resin article is utilized as a member that conducts heat efficiently between an exothermic body such as a chip and a heat releasing body such as a heat sink.

Here, as a means for endowing the resin with a high thermal conductivity, there has been known that a thermally conductive filler is oriented and dispersed in the resin in order to form a thermal conductive pass efficiently. Further, there has been proposed a thermally conductive resin sheet that is inserted, in order to enhance the heat releasing effect, between the electronic part and a heat releasing plate to make the thermal conductivity therebetween better and to improve the thermal conductivity in the thickness direction.

For example, in Patent Literature 1 (Japanese Patent Laid-Open Application H05-102355), there is disclosed an anisotropic thermally conductive sheet where a thermally conductive filler which is surface-treated by coating with a coupling agent is included in a matrix component, and the thermally conductive filler is oriented and dispersed in the thickness direction.

Further, for example, in Patent Literature 2 (Japanese Patent Laid-Open Application 2003-174127), there is disclosed an anisotropic thermally conductive sheet where a surface of a thermally conductive fiber is coated with an electric insulating material, and the thermally conductive fiber is oriented in the thickness direction of the sheet made of an organic polymer by electrostatically flocking.

PRIOR ART LITERATURE

Patent Literature

Patent Literature 1: Japanese Patent Laid-Open Application H05-102355
Patent Literature 2: Japanese Patent Laid-Open Application 2003-174127

SUMMARY OF INVENTION

Problem to be Solved by the Invention

However, in the thermally conductive molded resin sheets described in the above Patent. Literatures 1 and 2, since there is utilized the electric interaction such as the application of voltage and the electrostatic flocking in the production step, it is not suitable to the fields where the products can be inexpensively mass-produced.

In addition, since kinds of the usable thermally conductive filler and volumetric filling factor, and the like are restricted, the obtained thermal conductivity is not sufficient, and thus there is a problem that the heat releasing property required in various electronic devices is not completely satisfied.

Therefore, the object of the present invention is to provide a thermally conductive molded resin article that can be inexpensively mass-produced and that exhibits a low thermal resistance value as a result of reducing internal thermal resistance by high filling and reducing interfacial thermal resistance by improving cutting precision.

Means for Solving the Problem

In order to realize the above objects, as the results of the present inventors' intensive studies with respect to the structure of the thermally conductive molded resin article and the thermally conductive fillers to be used, the inventors have found that, when using fillers having different smaller and larger average particle sizes as the thermally conductive fillers, and an aspect ratio of the thermally conductive filler having the larger average particle size is within the specific range and is oriented approximately in the thickness direction, the objects can be effectively solved, and have completed the present invention.

Means for Solving the Problem

Namely, according to the present invention, there is provided a thermally conductive molded resin article, which comprises a resin and thermally conductive fillers including a first thermally conductive filler and a second thermally conductive filler having a smaller particle size than the first thermally conductive filler;

the first thermally conductive filler has an aspect ratio of 10 or more and is oriented approximately in the thickness direction of the thermally conductive molded resin article;

the resin is a silicone resin, an acrylic rubber, or a fluororubber; and the second thermally conductive filler has a thermal conductivity of more than 5 W/mK.

Further, a volumetric filling factor of the thermally conductive filler in the thermally conductive molded resin article is preferably 10 to 80% by volume, more preferably 40 to 60% by volume.

Further, in the thermally conductive molded resin article, it is preferable that a weld line of the resin is formed approximately in the thickness direction of the thermally conductive molded resin article.

The matter that the weld lines are formed approximately in the thickness direction of the thermally conductive molded article means that the thermally conductive molded article is formed by a many resin articles which are folded and welded in the perpendicular direction. The weld line may not only be a perfect straight line but also a curved like an arch, or may be partly discontinuous.

The "thermally conductive molded resin article" in the present invention means the concept that includes a block-like article after extrusion molding, a sliced article which is sliced the block-like article properly (including sliced sheet-line article). Further, the "particle size" is a concept of an average particle size in the particle size distribution measurement, and is measured by laser diffraction scattering method.

Effect of the Invention

According to the present invention, it is possible to provide a thermally conductive molded resin article that can be inexpensively mass-produced and that exhibits a low thermal resistance value as a result of reducing internal thermal resistance by high filling and reducing interfacial thermal resistance by improving cutting precision.

BRIEF EXPLANATION OF DRAWING

The drawing FIGURE is a schematic view (side view of T die) to explain the producing method of the thermally conductive molded resin sheet which is one embodiment of the thermally conductive molded resin article of the present invention.

EMBODIMENTS FOR SOLVING THE PROBLEM

Hereafter, one preferred embodiment of the thermally conductive molded resin article of the present invention will be explained in detail by referring drawings, but the present invention is not limited thereto. Furthermore, in the explanation hereafter, the same symbol is used for designating the same or corresponding part, and any redundant explanation may be omitted. In addition, since the drawing is presented to explain the concept of the present invention, there is a case where size or ratio is different from the real parts.

The thermally conductive molded resin sheet of the present embodiment comprises a resin and thermally conductive fillers including a first thermally conductive filler and a second thermally conductive filler having a smaller particle size than the first thermally conductive filler, the first thermally conductive filler has an aspect ratio of 10 or more and is oriented approximately in the thickness direction of the thermally conductive molded resin article, and the resin is a silicone resin, an acrylic rubber, or a fluororubber.

Namely, the thermally conductive molded resin sheet of the present embodiment comprises the resin and the thermally conductive fillers including the first thermally conductive filler and the second thermally conductive filler having a smaller particle size than the first thermally conductive filler. In other words, the particle size $D_1$ of the first thermally conductive filler and the particle size $D_2$ of the second thermally conductive filler has the relation of $D_1 > D_2$. It may be allowable that thermally conductive fillers other than the first thermally conductive filler and the second thermally conductive filler can be used, as long as within the range that does not impair the effect of the present invention.

The drawing FIGURE is a schematic view to explain the method for producing the thermally conductive molded resin sheet of the present embodiment, and shows a schematic sectional view of the top portion of an extruder and a T die. The T die of the extruder has a first gap of a gap X in the direction of up and down, a second gap of a gap Y in the direction of up and down which is continuous with the first gap, and an inclined surface on at least one of the upper and lower sides of a passage between the first gap and the second gap.

A resin composition of the thermally conductive molded resin article which contains the thermally conductive filler is stirred and kneaded by a screw 2 to be introduced to the first gap 4 (gap X) along with a passage 8. The flow of the resin composition is squeezed in the direction of up and down (thickness direction) relative to the direction of the flow in the extruder through the first gap 4 to be a thin belt. During passing through the first gap 4, the thermally conductive filler mixed in the resin orients in the flow direction of the resin composition. In this case, the thermally conductive filler orients in the direction of the surface of a thermally conductive resin sheet precursor.

The gap of the first gap 4 can be adjusted properly, and is, for example, 0.5 mm or more and 5.0 mm or less. When the gap of the first gap 4 is less than 0.5 mm, not only an extrusion pressure is unnecessarily increases but also the resin composition may be clogged. On the other hand, when the gap of the first gap 4 is larger than 5.0 mm, a degree of orientation of the thermally conductive filler with respect to the surface direction of the resin sheet precursor becomes decreased.

When the molded resin article precursor having a thin thickness where the thermally conductive filler orients in the flow direction of the resin composition completely passes through the first gap 4, since the sectional area of the passage 8 is enlarged and the length in the direction of up and down becomes long, the flow of the molded resin article precursor changes in the direction of up and down. Subsequently, the resin sheet precursor is folded substantially in the direction perpendicular to the flow in the first gap 4 in the downstream area of the first gap 4 (in the passage having the inclined surface), and the sheet-like molded resin article precursor is mixed and fused, and then extruded from the top of the second gap 6 in the integrated manner to produce the thermally conductive molded resin article (block-like article) of the present invention. In this case, the thermally conductive fillers orients approximately in the thickness direction of the thermally conductive molded resin article (block-like article).

Thereafter, by slicing the thermally conductive molded article (block-like article) which is crosslinked in the direction perpendicular to the orientating direction of the thermally conductive fillers to give a uniform thickness, the thermally conductive molded resin article (sheet) of the present invention can be produced.

Here, it is preferable that the gap Y of the second gap 6 is larger by twice or more and 40 times or less of the gap X of the first gap 4. The inclined surface on the upper and lower sides of the passage between the first gap 4 and the second gap 6 is formed preferably to be shaped into an inclined surface in order to reduce a pressure loss, and is desirably formed so as to adjust the degree of the inclination angle in order that the thermally conductive filler orients efficiently in the thickness direction of the resin sheet. The inclination angle is, for example, preferably 10 degrees to 50 degrees, further preferably 20 degrees to 30 degrees. It is not necessary to be inclined both of upper side and lower side, and it is also possible that either one side may be inclined.

Next, the resin which constitutes the thermally conductive molded resin article of the present embodiment acts as a matrix or a binder, and examples include silicone resin (silicone rubber and silicone gel), urethane rubber, acryl rubber, butyl rubber, ethylene propylene copolymer, ethylene vinyl acetate copolymer, and the like. Among them, particularly when molded, the silicone resin is excellent in flexibility, shape followability, adhesion to the heat generation surface when being contact with electronic parts, and further in thermal resistance, and is most suitable.

The silicone resin includes a silicone gel and a silicone rubber, and is roughly classified from the viewpoints of a small/large number of crosslinking points or a kind of crosslinking manner (addition reaction: platinum-based catalyst, condensation reaction: peroxide). Further, examples of the silicone rubber include a millable-type silicone and an addition reaction-type silicone.

The silicone gel can be filled with a larger amount of the thermally conductive fillers than the silicone rubber because of its low crosslinking points, and is more preferable. From the viewpoints of excellent in thermal resistance and electric insulation due to its low crosslinking points, the silicone rubber is suitable.

Next, the thermally conductive fillers including the first thermally conductive filler and the second thermally conductive filler are explained. As the thermally conductive fillers of the present invention, various known materials may be used within the scope that will not impair the effects of the present invention, and examples include boron nitride (BN), carbide, carbon fiber, mica, alumina, aluminum nitride, silicon carbide, silica, zinc oxide, magnesium oxide, calcium carbonate, magnesium carbonate, molybdenum disulfide, copper, aluminum, and the like.

The shape of the thermally conductive filler is not particularly limited, and may be selected in accordance with the desired aim, and examples of the shape include squamous, plate, film, mass, column, rectangular column, oval, plane, and the like. From the viewpoints that the thermally conductive pass is easy to be formed by distributing the second thermally conductive filler having a small particle size in the first thermally conductive filler having a large particle size, and that the first thermally conductive filler is easy to orientate in the resin easily, it is preferable that an aspect ratio of the first thermally conductive filler is 10 or more.

Further, from the viewpoint that the thermal conductivity of the matrix is improved by compounding the resin with the second thermally conductive filler having a small particle size, it is preferable that the thermal conductivity of the second thermally conductive filler having a small particle size is more than 5 W/mK. The upper limit of the thermal conductivity of the second thermally conductive filler may be 200 W/mK. The thermal conductivity can be measured according to a laser flash method. Examples of material of the second thermally conductive filler include boron nitride (BN), aluminum nitride, silicon carbide, alumina, magnesium oxide, magnesium carbonate, calcium carbonate, and the like.

When the volume of the composition as the precursor is assumed to be 100% by volume, a percentage of the thermally conductive filler can be 10 to 80% by volume, and determined optionally in accordance with the required thermal conductivity. In case that the percentage of the thermally conductive filler is less than 10% by volume, the thermal conductive effect may be decreased. In case that the percentage of the thermally conductive filler is more than 80% by volume, at the time when the thermally conductive resin sheet precursor passes through the first gap, though the resin sheet precursor is folded approximately in the direction perpendicular to the flow in the first gap, there is a problem that the resins are difficult to be fused therebetween.

When the volume of the composition as the precursor is assumed to be 100% by volume, a mixing ratio of the first thermally conductive filler and the second thermally conductive filler in the thermally conductive fillers can be optionally determined within the range that does not impair the effect of the present invention. Particularly, the ration may be that the first thermally conductive filler is 40 to 60% by volume and the second thermally conductive filler is 2 to 20% by volume, and more preferably that the first thermally conductive filler is 45 to 55% by volume and the second thermally conductive filler is 5 to 15% by volume.

According to the thermally conductive molded resin article of the present invention, in addition to the above resin and the thermally conductive fillers, usual blends or additives such as a reinforcing agent, a filler, a softening agent, a crosslinking agent, a crosslinking accelerator, a crosslinking accelerating aid, an antiaging agent, a tackifier, an antistatic agent, and a kneading adhesive may be optionally selected.

In the above, the typical embodiments of the present invention are explained, but the present invention is not limited to these embodiments, and various changes in design may be possible, those changes may be included within the present invention. In the following, the present invention is explained in detail by referring Examples and Comparative Examples.

EXAMPLE

Example 1

In accordance with the formulation described in Table 1, a crosslinking agent and a thermally conductive filler were kneaded to a silicone resin component with double rolls to obtain a ribbon sheet (composition as a precursor). As the silicone resin component, a silicone rubber "DY32 1005U" available from Dow Corning Toray Co., Ltd. was used, and a flame retardant component and a plasticizing component were used, and as the thermally conductive filler, "PT110" (plate-like boron nitride, average particle size 45 μm) available from Momenntive Co., Ltd. and "DAW-03" (alumina, average particle size 3 μm) available from Denka Company Limited were used. As the crosslinking agent, "RC-4" and "MR-53" available from Dow Corning Toray Co., Ltd., were used. A preferred flame retardant is one which contains a metal compound such as iron oxide, and "ME-41F" and "XC87-905" available from Momenntive Co., Ltd. were used. A preferred plasticizer is a silicone oil which has the same backbone as the silicone rubber and has a viscosity of from 100 cs to 10000 cs, and "KF-96-3000CS" available from Shin-Etsu Chemical Co., Ltd. was used.

Next, the ribbon sheet obtained in the aforementioned steps was extruded by a short axis extruder for rubber shown in the drawing FIGURE and having a vertically oriented die (mouthpiece) with the first gap of 1 mm and the second gap of 10 mm to obtain a thermally conductive molded resin article (block-like article) having a thickness of 10 mm where the plate-like boron nitride oriented in the thickness direction, and then the block-like article was subjected to crosslinking treatment at 170° C. for 30 minutes. The crosslinked block-like article was sliced in the direction perpendicular to the thickness direction to produce a thermally conductive molded resin article (sheet) 1 having a thickness of 500 μm.

[Evaluation Test]

(1) Thermal Resistance

A thermal resistance in the thickness direction of the obtained thermally conductive resin sheet was measured by using TIM TESTER 1300 under double standard measuring pressure, and the measured values are shown in Table 1. The measurement was done in usual manner in accordance with American Standard ASTM D5470.

(2) Cutting Precision

The cutting precision at the time of the above slicing procedure affects the thermal resistance value. When the cutting precision is poor, the thermal resistance at the contact interface increases, and accordingly the pressure dependence at the measurement of the thermal resistance increases. For example, in the case of low pressure, the thermal resistance of the contact interface is high, but in the case of high pressure, the thermal resistance of the contact interface is reduced by compressing the sheet.

The above cutting precision was evaluated by a ratio of the thermal resistance values at a measurement pressure of 500 kPa to the thermal resistance value at 100 kPa (thermal resistance value at 100 kPa measurement/thermal resistance value at 500 kPa measurement), and the ratio of less than 1.9 is evaluated as ○, the ratio of 1.9 or more and less than 2.3 is evaluated as Δ, and the ratio of 2.3 or more is evaluated as x. The results are shown in Table 1.

Example 2

A thermally conductive resin sheet 2 was prepared and evaluated in the same manner as in Example 1 except that "XGP" (plate-like boron nitride, average particle size 35 μm) and "DAW-03" (alumina, average particle size 3 μm) available from Denka Company Limited were used as the thermally conductive filler. The results are shown in Table 1.

Example 3

A thermally conductive resin sheet 2 was prepared and evaluated in the same manner as in Example 1 except that "SGPS" (mass-like boron nitride, average particle size 12 μm) and "DAW-03" (alumina, average particle size 3 μm) available from Denka Company Limited were used as the thermally conductive filler. The results are shown in Table 1.

Example 4

A thermally conductive resin sheet 2 was prepared and evaluated in the same manner as in Example 1 except that "XGP" (plate-like boron nitride, average particle size 35 μm) and "SGPS" (mass-like boron nitride, average particle size 12 μm) available from Denka Company Limited were used as the thermally conductive filler. The results are shown in Table 1.

Example 5

A thermally conductive resin sheet 2 was prepared and evaluated in the same manner as in Example 1 except that "XGP" (plate-like boron nitride, average particle size 35 μm), "SGPS" (mass-like boron nitride, average particle size 12 μm) and "DAW-03" (alumina, average particle size 3 μm) available from Denka Company Limited were used as the thermally conductive filler. The results are shown in Table 1.

Comparative Example 1

A comparative thermally conductive resin sheet 1 was prepared and evaluated in the same manner as in Example 1 except that only "XGP" (plate-like boron nitride, average particle size 35 μm) available from Denka Company Limited was used as the thermally conductive filler. The results are shown in Table 1.

Comparative Example 2

A comparative thermally conductive resin sheet 2 was prepared and evaluated in the same manner as in Example 1 except that only "XGP" (plate-like boron nitride, average particle size 35 μm) available from Denka Company Limited was used as the thermally conductive filler. The results are shown in Table 1.

Comparative Example 3

A comparative thermally conductive resin sheet 3 was prepared and evaluated in the same manner as in Example 1 except that "HGP" (plate-like boron nitride, average particle size 5 μm) available from Denka Company Limited and "DAW-03" (alumina, average particle size 3 μm) available from Denka Company Limited were used as the thermally conductive filler. The results are shown in Table 1.

Comparative Example 4

In accordance with the formulation described in Table 1, a crosslinking agent and a thermally conductive filler were kneaded to a silicone resin component with double rolls to obtain a sheet having a thickness of 2 mm. As the silicone resin component, a silicone rubber "DY32 1005U" available from Dow Corning Toray Co., Ltd. was used, and a flame retardant component and a plasticizing component were used, and as the thermally conductive filler, "XGP" (plate-like boron nitride, average particle size 35 μm) and "DAW-03" (alumina, average particle size 3 μm) available from Denka Company Limited were used. As the crosslinking agent, "RC-4" and "MR-53" available from Dow Corning Toray Co., Ltd., were used. A preferred flame retardant is one which contains a metal compound such as iron oxide, and "ME-41F" and "XC87-905" available from Momenntive Co., Ltd. were used. A preferred plasticizer is a silicone oil which has the same backbone as the silicone rubber and has a viscosity of from 100 cs to 10000 cs, and "KF-96-3000 CS" available from Shin-Etsu Chemical Co., Ltd. was used.

Next, a sheet having thickness of 10 mm was prepared by piling 5 sheets having a thickness of 2 mm, and was subjected to crosslinking treatment at 170° C. for 30 minutes. The crosslinked sheet was sliced in the direction perpendicular to the thickness direction to produce a comparative thermally conductive resin sheet 4 having a thickness of 500 μm, and then the sheet was evaluated in the same manner as in Example 1. The results are shown in Table 1.

Comparative Example 5

A comparative thermally conductive resin sheet 5 was prepared and evaluated in the same manner as in Example 1 except that "XGP" (plate-like boron nitride, average particle size 35 μm) available from Denka Company Limited and "SYLYSIA740" (fine silica powder, average particle size 5 μm) available from Fuji SYLYSIA CHEMICAL LTD. were used as the thermally conductive filler. The results are shown in Table 1.

TABLE 1

| | | Ex. 1 | Ex. 2 | Ex. 3 | Ex. 4 | Ex. 5 |
|---|---|---|---|---|---|---|
| Formulation | First thermally conductive filler | BN 45 μm 50 vol % | BN 35 μm 50 vol % | BN 12 μm 50 vol % | BN 35 μm 50 vol % | BN 35 μm 50 vol % |
| | Second thermally conductive | Alumina 3 μm | Alumina 3 μm | Alumina 3 μm | BN 12 μm | BN 12 μm |

TABLE 1-continued

|  |  |  |  |  |  |  |
|---|---|---|---|---|---|---|
|  | filler | 10 vol % | 10 vol % | 10 vol % | 10 vol % | 5 vol % |
|  | Other thermally conductive filler | — | — | — | — | Alumina 3μ 5 vol % |
|  | Silicone resin component | 18 vol % | 18 vol % | 18 vol % | 18 vol % | 18 vol % |
|  | Crosslinking agent | 2 vol % | 2 vol % | 2 vol % | 2 vol % | 2 vol % |
|  | Oil component | 20 vol % | 20 vol % | 20 vol % | 20 vol % | 20 vol % |
| Structure | Aspect ratio | About 40 | About 30 | About 10 | About 30 | About 30 |
|  | Orientaion direction | Perpendicular | Perpendicular | Perpendicular | Perpendicular | Perpendicular |
|  | Thermal conductivity of second thermally conductive filler | 32 | 32 | 32 | 100-200 | 100-200 32 (other thermally conductive |
| Evaluation results | 100 kPa Thermal resistance (° C. cm$^2$/W) | 1.3 | 1.0 | 1.3 | 0.7 | 0.8 |
|  | 500 kPa Thermal resistance (° C. cm$^2$/W) | 0.6 | 0.6 | 0.9 | 0.4 | 0.5 |
|  | Cutting precision (Thermal resistance ratio) | Δ (2.2) | ○ (1.7) | ○ (1.4) | ○ (1.8) | ○ (1.6) |

|  |  | Com. Ex. 1 | Com. Ex. 2 | Com. Ex. 3 | Com. Ex. 4 | Com. Ex. 5 |
|---|---|---|---|---|---|---|
| Formulation | First thermally conductive filler | BN 35 μm 60 vol % | BN 35 μm 50 vol % | BN 5 μm 50 vol % | BN 35 μm 50 vol % | BN 35 μm 50 vol % |
|  | Second thermally conductive filler | — | — | Alumina 3 μm 10 vol % | Alumina 3 μm 10 vol % | Silica 3 μm 10 vol % |
|  | Other thermally conductive filler | — | — | — | — | — |
|  | Silicone resin component | 18 vol % | 18 vol % | 18 vol % | 18 vol % | 18 vol % |
|  | Crosslinking agent | 2 vol % | 2 vol % | 2 vol % | 2 vol % | 2 vol % |
|  | Oil component | 20 vol % | 20 vol % | 20 vol % | 20 vol % | 20 vol % |
| Structure | Aspect ratio | About 30 | About 30 | About 4 | About 30 | About 30 |
|  | Orientaion direction | Perpendicular | Perpendicular | Perpendicular | Surface | Perpendicular |
|  | Thermal conductivity of second thermally conductive filler | — | — | 32 | 32 | 1.4 |
| Evaluation results | 100 kPa Thermal resistance (° C. cm$^2$/W) | 1.9 | 1.9 | 1.9 | 2.8 | 1.6 |
|  | 500 kPa Thermal resistance (° C. cm$^2$/W) | 0.8 | 1.0 | 1.5 | 2.2 | 1.0 |
|  | Cutting precision (Thermal resistance ratio) | x (2.4) | Δ (1.9) | ○ (1.3) | ○ (1.3) | ○ (1.6) |

The results of Table 1 show that, according to the present invention, it is possible to obtain the thermally conductive resin sheet which exhibits a low thermal resistance due to a low thermal resistance value as a result of reducing internal thermal resistance by high filling and reduction of interfacial thermal resistance by improving cutting precision.

EXPLANATION OF SYMBOL

2 Screw
4 First gap
6 Second gap
8 Passage

The invention claimed is:

1. A thermally conductive molded resin sheet article having a length, a width, and a thickness perpendicular to the length and width, which comprises
 a resin and
 thermally conductive fillers including
  a first thermally conductive filler and
  a second thermally conductive filler having a smaller particle size than the first thermally conductive filler;
 the first thermally conductive filler has an aspect ratio of 10 or more and is oriented in the thickness direction of the thermally conductive molded resin article;
 the resin is a silicone resin, an acrylic rubber, or a fluororubber; and
 the second thermally conductive filler has a thermal conductivity of more than 5 W/mK;
 wherein a weld line of the resin is formed in the thickness direction of the thermally conductive molded resin article.

2. A method of forming a thermally conductive molded resin sheet article having a length, a width, and a thickness perpendicular to the length and width, comprising the steps of
 providing a composition that comprises
  a resin and
  thermally conductive fillers including
   a first thermally conductive filler and
   a second thermally conductive filler having a smaller particle size than the first thermally conductive filler;
 wherein
  the first thermally conductive filler has an aspect ratio of 10 or more;
  the resin is a silicone resin, an acrylic rubber, or a fluororubber; and
  the second thermally conductive filler has a thermal conductivity of more than 5 W/mK, and
 conducting extrusion molding of the composition to form a thermally conductive molded resin article,
  wherein the first thermally conductive filler is oriented in the thickness direction of the thermally conductive molded resin article, and
  wherein a weld line of the resin is formed in the thickness direction of the thermally conductive molded resin article.

* * * * *